United States Patent
Thomas et al.

(10) Patent No.: US 6,743,652 B2
(45) Date of Patent: Jun. 1, 2004

(54) METHOD FOR MAKING AN INTEGRATED CIRCUIT DEVICE INCLUDING PHOTODIODES

(75) Inventors: Danielle A. Thomas, Dallas, TX (US); Gilles E. Thomas, Dallas, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/061,857

(22) Filed: Feb. 1, 2002

(65) Prior Publication Data

US 2003/0148574 A1 Aug. 7, 2003

(51) Int. Cl.[7] .............................................. H01L 21/00
(52) U.S. Cl. .............................. 438/48; 438/45; 438/57; 438/73; 438/200; 438/210; 438/237; 438/380
(58) Field of Search ................................ 438/45, 48, 57, 438/73, 200, 210, 237, 380; 257/292

(56) References Cited

U.S. PATENT DOCUMENTS

| 4,149,048 A | 4/1979 | Winter et al. |
| 4,606,115 A | 8/1986 | Kervin et al. |
| 4,670,765 A | 6/1987 | Nakamura et al. |
| 5,049,733 A | 9/1991 | Yoshifusa et al. |
| 5,105,090 A | 4/1992 | Miyajima et al. |
| 5,177,581 A | 1/1993 | Kubo et al. |
| 5,994,162 A | 11/1999 | Burghartz et al. |
| 6,040,593 A * | 3/2000 | Park ........................... 257/292 |
| 6,570,222 B2 * | 5/2003 | Nozaki et al. .............. 257/347 |
| 2002/0027239 A1 * | 3/2002 | Ohkubo ....................... 257/292 |

FOREIGN PATENT DOCUMENTS

EP 0 987 767 A 3/2000

* cited by examiner

Primary Examiner—Jack Chen
(74) Attorney, Agent, or Firm—Lisa K. Jorgenson; Peter J. Thoma

(57) ABSTRACT

Fast and efficient photodiodes with different structures are fabricated using CMOS process technology by adapting transistor structures to form the diode structures. The anode regions of the photodiodes correspond to either PLDD regions of PMOS transistors or P-wells of NMOS transistors to provide two different photodiode structures with different anode region depths and thus different drift region thicknesses. An antireflective film used on the silicon surface of the photodiodes is employed as a silicide-blocking mask at other locations of the device.

5 Claims, 2 Drawing Sheets

FIG. 1C
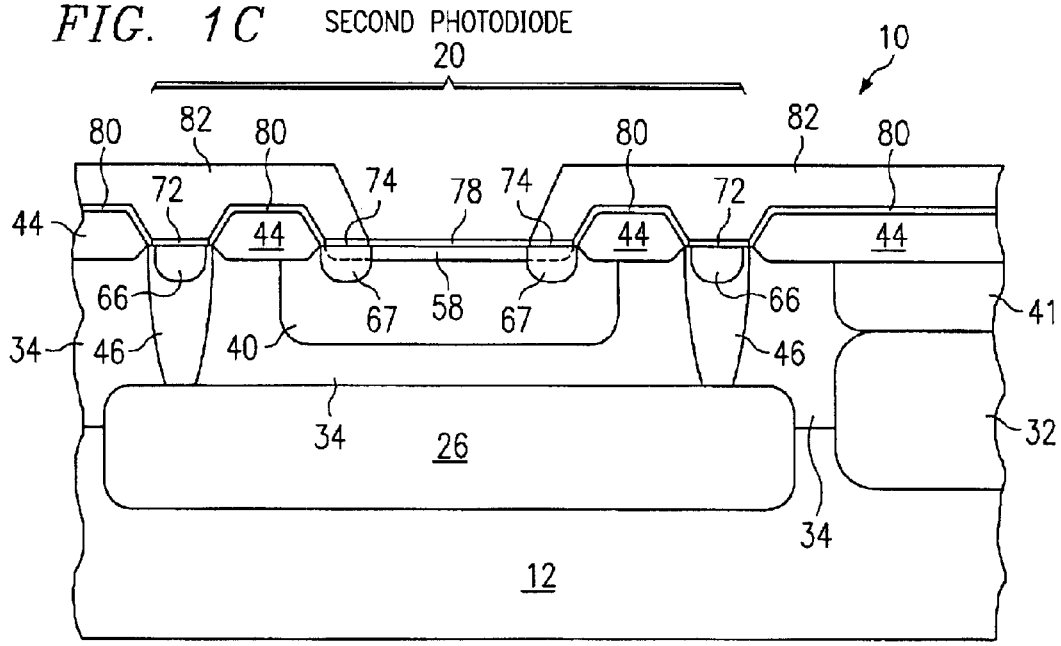
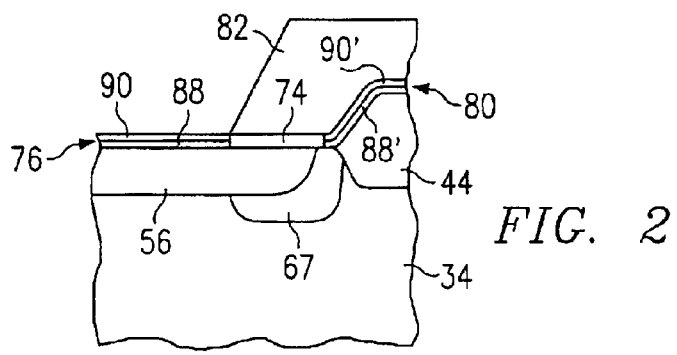
FIG. 2
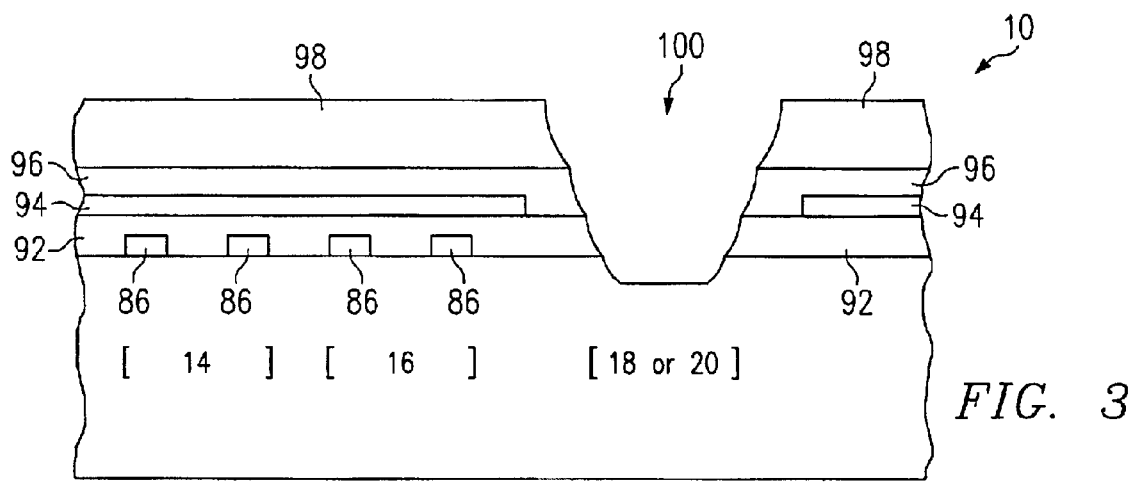
FIG. 3

METHOD FOR MAKING AN INTEGRATED CIRCUIT DEVICE INCLUDING PHOTODIODES

CROSS-REFERENCE TO RELATED APPLICATIONS

This application is related to U.S. patent application Ser. No. 10/061,920 entitled, "Integrated Circuit Device Including Two Types of Photodiodes," which was filed on Feb. 1, 2002, and issued as U.S. Pat. No. 6,580,109 B1.

BACKGROUND OF THE INVENTION

The present invention generally relates to semiconductor photodiodes, and more particularly to an integrated circuit device that includes photodiodes, and a process for its fabrication.

The structure and function of semiconductor photodiodes are well known in the art. Photodiodes convert electromagnetic radiation in the form of photons into electrical energy. Typical photodiodes operate in the visible and near-infrared range of the electromagnetic radiation spectrum. Different semiconductor materials determine the particular wavelength of the radiation to which the photodiode responds. Photodiodes can be fabricated from elemental semiconductors, such as germanium and silicon, as well as so-called III-V compound semiconductors, such as gallium-arsenide.

A typical photodiode includes a surface P-type anode region to which an anode contact is formed. An antireflective film overlies the P-type region and is structured to assure a high degree of transmission of radiation at the wavelength that the photodiode is designed to absorb. Beneath the P-type region is a very lightly-doped N-type drift region in which photons of the incident radiation are absorbed, generating hole-electron pairs. Adjoining the N-type drift region is a heavily-doped N+ cathode region, to which a cathode contact is formed at a surface of the device. The PN junction between the P-type anode region and the N-type drift region is reverse biased by an applied potential producing a depletion layer on both sides of the junction. Because the N-type drift region is relatively lightly doped, the depletion layer predominantly resides on the N-type side of the junction extending deeply into the drift region. Holes and elections generated in the depletion layer are swept in opposite directions in response to the applied potential, providing a current that is a function of the incident radiation.

It is desirable for certain applications to include more than one photodiode as part of an integrated circuit. U.S. Pat. No. 5,177,581 is an example of a prior-art patent describing the incorporation of multiple identical photodiodes on an integrated circuit chip.

It is known that trade-offs in the design of photodiodes determine various operational characteristics. Also, when integrating a photodiode on the same semiconductor chip as other elements (transistors, resistors, etc.) to perform complex functions in response in part to incident radiation signals, the constraints of the process for making such other elements must be considered in the design of the photodiode. It is desirable to minimize the complexity of a semiconductor fabrication process while maximizing the flexibility available to the designer to provide complex functionality in the device design. The inclusion of a photodiode on an integrated circuit chip made with state-of-the-art CMOS or BiCMOS process technology contributes to the foregoing design considerations. CMOS devices include complementary types of MOS transistors (both PMOS and NMOS). BiCMOS devices include MOS transistors as well as bipolar transistors.

SUMMARY OF THE INVENTION

In accordance with a principal object of the invention, photodiodes of different structures are integrated on a semiconductor chip with transistors defining an integrated circuit. The photodiodes are built up using structures that correspond to structures of the transistors. Thus, a process for making a CMOS integrated circuit device can be adapted without altering the process steps by using different photomasks to incorporate the photodiodes along with PMOS and NMOS transistors into a single optoelectronic integrated circuit device.

Both fast and efficient types of photodiodes can be integrated on the same chip using anode regions of different depths, the anode regions corresponding to PLDD regions of PMOS transistors or to P-wells of NMOS transistors. An antireflective film used over the silicon surface of the photodiodes also functions as a silicide-blocking mask at other locations on the device.

BRIEF DESCRIPTION OF THE DRAWINGS

For a more complete understanding of the present invention and the advantages thereof, reference is now made to the following description taken in conjunction with the accompanying drawings, in which:

FIG. 1C is a vertical cross-section of yet another portion of the inventive device showing a second of two different types of photodiodes included in the device;

FIG. 2 is an enlarged cross-sectional view of a portion of the structure of FIG. 1B showing additional details; and FIG. 3 is a vertical cross-section of a portion of the inventive device showing upper level conductive and insulating layers that have been added to the structures of FIGS. 1A, 1B and 1C.

In the figures, cross-hatching has been left out for simplicity and clarity of illustration. It will be appreciated that the accompanying drawing figures are schematic in nature and not to scale. Process variations may also cause slight variations in structure.

DESCRIPTION OF THE PREFERRED EMBODIMENTS

Figure 1A:
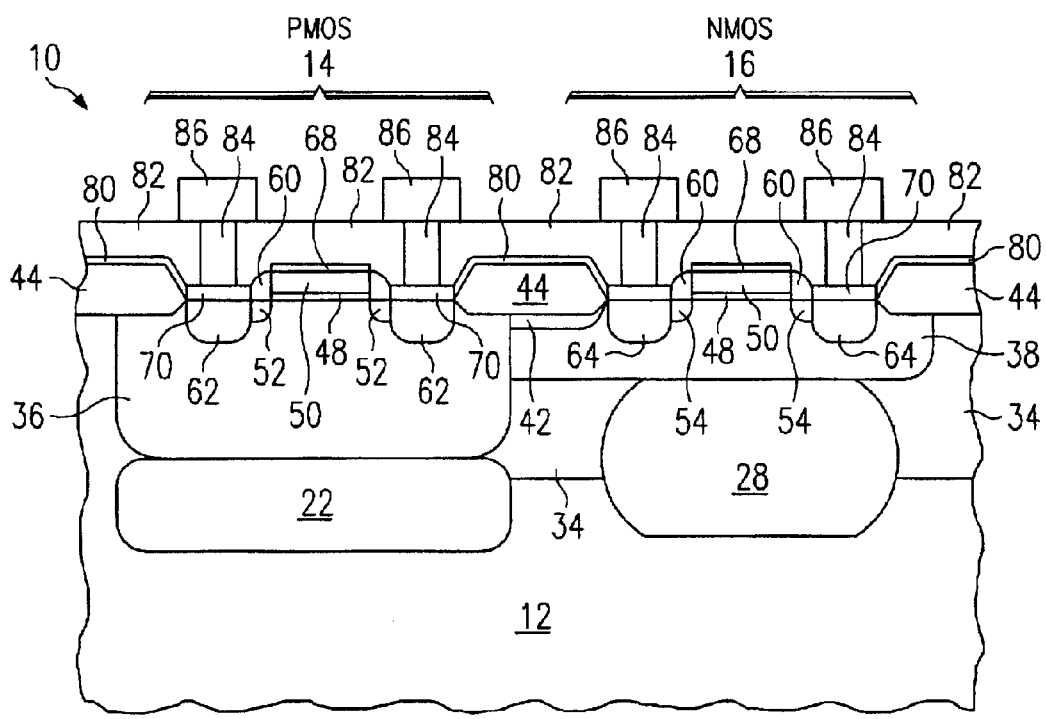
FIG. 1A is a vertical cross-section of a portion of a device fabricated and structured according to the invention, the portion showing representative PMOS and NMOS transistors.
Figure 1B:
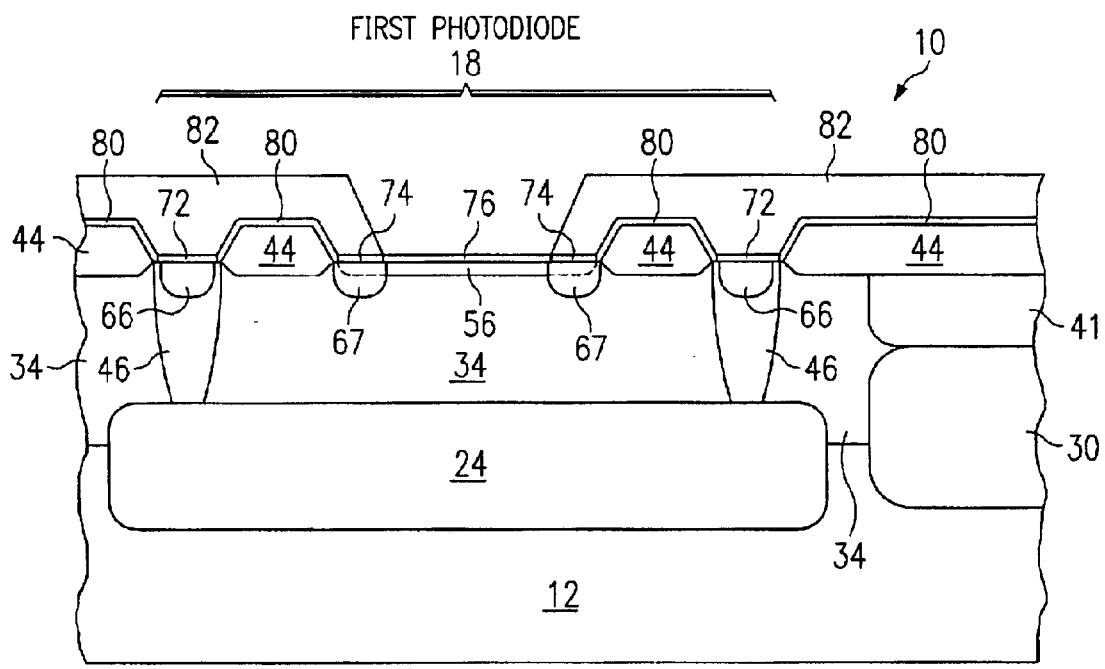
FIG. 1B is a vertical cross-section of another portion of the inventive device showing a first of two different types of photodiodes included in the device.

FIGS. 1A, 1B and 1C show representative portions of a semiconductor integrated circuit device 10 made and structured in accordance with the present invention. FIGS. 1A, 1B and 1C show the device 10 at a stage in the fabrication process at which transistor and diode structures have been formed, but prior to the inclusion of upper protective layers, which are shown in FIG. 3 and described more fully below.

The device 10 is fabricated on a lightly-doped P-type substrate 12, which is preferably silicon having a resistivity of 10 to 20 ohm-cm. FIG. 1A shows a PMOS transistor 14 adjacent to an NMOS transistor 16, which are representative of a plurality of such MOS (metal-oxide-semiconductor) transistors that define various circuits of the device 10. Bipolar transistors (not shown) may also be included in the device 10. A PMOS transistor is characterized by P-type source and drain regions with an N-type region therebetween in which a channel of positive charge carriers (holes) can be induced by applying a negative voltage to a gate electrode located above the channel region. An NMOS transistor is characterized by N-type source and drain regions with a P-type region therebetween in which a channel of negative charge carriers (electrons) can be induced by applying a positive voltage to a gate electrode located above the channel region.

FIG. 1B shows a first photodiode 18, which is representative of one or more such diode structures of the device 10. FIG. 1C shows a second photodiode 20, which is representative of one or more such diode structures of the device 10. The plurality of PMOS and NMOS transistors 14 and 16 and first and second type photodiodes 18 and 20 are elements of an integrated circuit that is useful in various different applications in which light signals are used as inputs to electronic circuitry within a larger apparatus or system. For example, certain optoelectronic systems use red laser light at a wavelength of 635 nanometers. The photodiodes 18 and 20 can be structured to respond to such red laser light (or some other wavelength) as will become apparent from the following description.

Various conventional semiconductor device fabrication techniques can be used to make the device 10. N+ buried regions 22, 24 and 26 can be formed by selectively implanting an N-type dopant, for example phosphorus, into upper surface portions of the substrate 12 prior to epitaxial growth. Similarly, P+ isolation regions 28, 30 and 32 can be formed by selectively implanting boron into upper surface portions of the substrate 12 prior to epitaxial growth. The designations N+ and P+ indicate that relatively heavy concentrations of dopants (phosphorus or boron) have been provided in these regions. Following these initial implant steps, a very lightly-doped N-type epitaxial layer 34 is grown on the substrate 12. During thermal processing, for example as the epitaxial silicon grows at an elevated temperature, the N+ buried regions 22, 24 and 26, and the P+ isolation regions 28, 30 and 32, diffuse up part way into the epitaxial layer 34, so that such regions reside in upper portions of the substrate 12 and lower adjoining portions of the epitaxial layer 34 in the final device 10. The epitaxial layer 34 and the substrate 12 together define a monocrystalline silicon portion of the device 10 above which various insulators and conductors are formed to interconnect circuit elements of the device.

In the next stage of processing steps, wells of opposite conductivity type are formed, including an N-well 36, which forms part of the PMOS transistor 14, a P-well 38, which forms part of the NMOS transistor 16, a P-well 40, which forms part of the second photodiode 20, and P-wells 41, which are provided above P+ isolation regions 30 and 32 to extend the P-type material from regions 30 and 32 to the upper epitaxial silicon surface. The N-well 36 and similar N-wells (not shown) at other locations within the device 10 are preferably formed by ion implantation of phosphorus resulting in an intermediate dopant concentration. The P-wells 38, 40 and 41 and similar P-wells (not shown) at other locations within the device 10 are preferably formed simultaneously by ion implantation of boron resulting in an intermediate dopant concentration. Also, at this stage, a P-type field implant step is performed to form a P+ channel stop 42. The techniques for fabricating these structures are conventional in semiconductor device manufacturing.

Next, a field oxide 44 is grown to a thickness of about 6,000 angstroms in selected areas of the device 10 using conventional patterning techniques. The field oxide 44 separates active silicon regions in which various transistors, resistors and diodes will be formed in the device 10. Next, N+ sinkers 46 are formed by a deep ion implantation of phosphorus to form conductive paths from the N+ buried layers 24 and 26 up to the silicon surface.

In the next stage of processing steps, transistor gate structures and source and drain regions are formed. With reference to FIG. 1A, thin gate oxide layers are grown on the silicon surface above the N-well 36 and the P-well 38. Phosphorus doped polysilicon is then deposited on the device including atop the gate oxide layers. Then, using conventional photolithographic and dry etching techniques, the polysilicon and gate oxide layers are patterned to define gate oxide layers 48 and polysilicon gates 50.

Next, lightly doped drain ("LDD") implantation steps are performed to form PLDD regions 52 by implanting a light dose of boron ions in small surface portions of the active area of the PMOS transistor 14, and NLDD regions 54 by implanting a light dose of phosphorus ions in small surface portions of the active area of the NMOS transistor 16. The polysilicon gates 50 are sufficiently thick to block the LDD implants from reaching the channel regions in the silicon immediately under the gate oxide layers 48. The PLDD implantation step also simultaneously forms shallow P-type regions 56 and 58 in the photodiodes 18 and 20 shown in FIGS. 1B and 1C. After the LDD implantations, sidewall oxide spacers 60 are formed using conventional techniques on the opposite sides of the polysilicon gates 50 along their vertical edges, as shown in FIG. 1A. Next, source and drain implant steps are carried out to produce P+ source/drain regions 62 in the PMOS transistor 14, and N+ source/drain regions 64 in the NMOS transistor 16, as shown in FIG. 1A. The designation "source/drain" is used herein since a source region is distinguished from a drain region by the way the transistor is connected in the circuit of the device 10 rather than by the structures of these regions.

The source/drain regions 62 of PMOS transistor 14 are heavily doped P+ using boron, and the source/drain regions 64 of the NMOS transistor 16 are heavily doped N+ using arsenic. The same process steps used to form the N+ arsenic-doped regions 64 are used to form N+ cathode contact regions 66 within the upper portions of the N+ sinkers 46 shown in FIGS. 1B and 1C. The same process steps used to form the P+ boron-doped regions 62 of FIG. 1A are used to form P+ anode contact regions 67 within the diode structures 18 and 20 of FIGS. 1B and 1C. For simplicity of illustration, the lightly-doped P-type regions 56 and 58 are shown with dashed lines extending into the P+ contact regions 67, which are much more heavily doped.

It is conventional to lower the contact resistance of the silicon regions and polysilicon layers to which contacts are formed. This is ordinarily done by a process called silicidation, in which a refractory metal film is deposited on the device and reacted at an elevated temperature with the silicon with which it comes into contact. Preferably, the refractory metal is titanium and titanium silicide is formed on the exposed silicon surfaces. In FIG. 1A, resulting thin titanium silicide contact layers are formed on the polysilicon gates 50 and on the source/drain regions 62 and 64 of the transistors 14 and 16. The silicide contact layers on the polysilicon gates 50 are designated by numeral 68. The silicide contact layers on the source/drain regions 62 and 64 are designated by numeral 70. Referring to FIGS. 1B and 1C, silicide contact layers 72 are formed on the silicon surface above the N+ contact regions 66, and silicide contact layers 74 are formed on the silicon surface above the P+ contact regions 67.

It is conventional to form passive elements (resistors and capacitors) in doped surface regions of an epitaxial layer in a typical device. Such resistors are called "silicon resistors" to distinguish them from "polysilicon resistors," which may be formed in portions of polysilicon strips disposed above the silicon surface. In order to obtain a resistance for such silicon resistors that depends on the resistivity of the silicon in the doped surface epitaxial region and on the dimensions of such region, it is necessary to use a thin dielectric film as a silicide-blocking mask to prevent silicidation of the resistor's surface, except for two contact points at its opposite ends. Likewise, a silicide-blocking mask may be used to cover a portion of a polysilicon strip where a circuit designer chooses to form a polysilicon resistor.

In accordance with a feature of the invention, the same silicide-blocking mask that is used to prevent silicidation at certain sites on the device is used to prevent silicidation of silicon surface portions at photodiode sites. Such portions of the silicide-blocking mask are left in place at the photodiode sites to serve as an antireflective dielectric film for the photodiodes. In particular, with reference to FIGS. 1B and 1C, antireflective dielectric films 76 and 78 are formed above the respective P-type regions 56 and 58. These antireflective films 76 and 78 originate from a common dielectric film that is formed over the entire device 10 as a silicide-blocking mask, which is selectively removed at sites where silicidation is desired. For example, such portions of the silicide-blocking mask are removed from over the silicon where contact layers 70 are to be formed in FIG. 1A and where contact layers 72 and 74 are to be formed in FIGS. 1B and 1C. Portions of the silicide-blocking mask remain over the field oxide 44 and are designated by numeral 80 in FIGS. 1A, 1B and 1C. It will be appreciated that the starting dielectric film that becomes the individual film portions 76, 78 and 80 is removed only where it is desired to form silicide contact layers, such as layers 68, 70, 72 and 74. For ease of manufacturing, the silicide-blocking mask also may be removed over the sidewall oxide spacers 60, as seen in FIG. 1A.

After silicidation, a planarized interlevel dielectric layer (ILD) 82 is formed as shown in FIG. 1A. The ILD layer 82 may be formed by depositing more than one type of dielectric materials in successive sublayers. Optionally, about the lowermost 1500 angstroms of ILD layer 82 could be undoped silicon oxide. The ILD layer 82 may be planarized by conventional chemical mechanical polishing (CMP) techniques. The ILD layer 82 also appears in FIGS. 1B and 1C but is shown with portions removed over the photodiodes 18 and 20. The removal of portions of ILD layer 82 from over the photodiodes 18 and 20 occurs during a window formation sequence of steps, which is described more fully below in connection with FIG. 3.

Referring again to FIG. 1A, openings are dry etched over the silicide contact layers 70. Then, tungsten plugs 84 are formed in the openings using known techniques. Next, aluminum contacts 86 are formed to enable circuit interconnections of various elements within the device 10.

Referring to FIGS. 1B and 1C, it will be appreciated that tungsten plugs (not shown) will also be provided in contact with the silicide contact layers 72 and 74 above the contact regions 66 and 67 to enable cathode and anode connections to be made to the photodiodes 18 and 20. Aluminum contacts (not shown) will also be made to the tungsten plugs at these sites to enable interconnection of the photodiodes 18 and 20 with other circuit elements of the device 10. The tungsten plugs and aluminum contacts are not shown in FIGS. 1B and 1C for simplicity, but they would be formed using the same process steps that are used to form the tungsten plugs 84 and aluminum contacts 86 shown in FIG. 1A.

The photodiodes 18 and 20 of FIGS. 1B and 1C are typically laid out in a rectangular pattern viewed from above, preferably having a length to width ratio of 1.5, which improves optical sensitivity. The P+ anode contact regions 67 and silicide contact layers 74 are laid out around the periphery of the rectangular P-type regions 56 and 58 within the bordering portions of the field oxide 44. The P+ contact regions 67 extend to the silicon surface where they are contacted by the silicide anode contacts 74, both of which structures are annular when viewed from above, extending around the periphery of the respective P-type regions 56 and 58. The silicide contacts 72 and the tungsten plugs (not shown) in contact therewith define cathode contacts within the device 10 for the photodiodes 18 and 20. The buried layers 24 and 26 are also rectangular viewed from above. Also, sinkers 46, contact regions 66 and cathode contacts 72 are annular in shape when viewed from above and conform to the shape of the underlying buried layers 24 and 26. The previously mentioned tungsten plugs (not shown in FIGS. 1B and 1C) that contact the silicide contacts 72 and 74 are provided at discrete locations in a pattern corresponding to the annular-shaped contact regions 66 and 67. However, the cross-sections of FIGS. 1B and 1C are taken for simplicity of illustration through planes that do not pass through those particular tungsten plugs.

Referring now to FIG. 2, which shows an enlarged portion of FIG. 1B, additional detailed features of the invention will be described. The antireflective film 76 preferably comprises two distinct dielectric layers, including a lower silicon oxide layer 88 and an upper silicon nitride layer 90. These two layers have corresponding portions 88' and 90' that form the dielectric film 80, which overlies the field oxide 44. As previously mentioned the films 76 and 80 are portions of the same starting dielectric film that serves the dual purpose of a silicide-blocking mask and an antireflective film. After depositing the thin oxide and nitride layers that make up films 76 and 80, which start as continuous sheets, portions are selectively removed by conventional photolithographic masking and etching techniques so that silicide contact layers can be formed where desired. In FIG. 2 these oxide and nitride layers have been removed from over the silicon surface where silicide contact layer 74 is formed. ILD layer 82, which is shown over silicide contact layer 74, has been formed and partially cut away to expose the antireflective film 76. The photodiode 20 of FIG. 1C is similar in structure to the photodiode 18 of FIG. 1B except that P-well 40 has been added to photodiode 20. Thus, it will be appreciated that the same oxide layer 88 and nitride layer 90 explicitly shown in FIG. 2 as comprising component layers of the antireflective film 76 of FIG. 1B also comprise component layers of the antireflective film 78 of FIG. 1C.

The thicknesses of oxide layer 88 and nitride layer 90 are selected depending on the wavelength of the light to which the photodiode is designed to respond in its end-use application. The thicknesses are selected to achieve ideally 100 percent transmission of the incoming light through the layers 90 and 88 down into the underlying silicon. By way of example, if the photodiode is designed to respond to red laser light at a wavelength of 635 nanometers, oxide layer 88 is made 30 nanometers thick and nitride layer 90 is made 50 nanometers thick to achieve nearly 100 percent light transmission therethrough.

Now referring to FIG. 3, the device 10 is shown with the final upper layers applied. For ease of illustration, only the upper layers are shown in detail, it being understood that the PMOS transistor 14 and the NMOS transistor 16 of FIG. 1A as well as one of the photodiodes 18 or 20 of either FIG. 1B or FIG. 1C are included in the structure of FIG. 3. The transistors and the photodiode are located in the device in locations corresponding to where the bracketed numerals are provided in FIG. 3. In other words, the portion of the finished device 10 shown in FIG. 3 is a schematic composite either of FIGS. 1A and 1B or of FIGS. 1A and 1C with additional top layers provided, as will now be described.

As seen in FIG. 3, a second planarized ILD layer 92 is formed over the aluminum contacts 86. This second ILD layer 92 also overlies the first ILD layer 82, which is explicitly shown in FIGS. 1A, 1B, 1C and 2. Then, a metal deposition and patterning sequence follows to form metal screen plate 94, which overlies most of the area of the device 10 except over the photodiode locations, as depicted in FIG. 3. The metal for the screen plate 94 may be aluminum. The screen plate 94 prevents light from entering the underlying silicon except in the areas of the photodiodes. The use of such a screen plate 94 is particularly important when the semiconductor chip is not housed in a conventional package in its end-use application. Stray light can affect the gain, leakage current and threshold voltage of transistors, which the screen plate 94 avoids. Next, a thick passivation layer 96 is deposited atop the metal screen plate 94 and the portions of the ILD layer 92 that are not covered by the plate 94. The layer 96 is very thick, preferably more than one micron, and may comprise multiple sublayers, preferably including a lower doped oxide sublayer and an upper oxynitride sublayer, which are not shown separately. Finally, an optional polyimide layer 98 may be included as the top layer of the device 10 formed atop the passivation layer 96. The polyimide layer 98 serves to reduce stress on the device 10 during subsequent packaging.

The final sequence of processing steps proceeds with the opening of windows over each of the photodiodes of the device 10. Referring again to FIG. 3, a window 100 is opened over photodiode 18 (or 20). First, the polyimide layer 98 is selectively removed in a rectangular area over each photodiode location. Then, the passivation layer 96 and upper ILD layer 92 are etched in corresponding rectangular patterns. The etching continues down through lower ILD layer 82, the result of which is shown in FIGS. 1B, 1C and 2, which only show the lower layers of the device. Referring specifically to FIG. 2, the etching stops when the nitride layer 90 is exposed. The etching selectively attacks the ILD layer 82 without removing the nitride layer 90 to any significant degree. It will be appreciated that a combination of different types of etching steps can be used to add control to the process to achieve good definition of the final structure.

The techniques used to open windows 100 over the various photodiodes within the device 10 are similar to techniques used to open windows to conventional bonding pads (not shown) that typically appear at the periphery of semiconductor chips. After processing of multiple chips on larger circular wafers, the chips are separated and may be packaged in protective housings as finished devices. Such packaging techniques are well known.

Referring again to FIGS. 1B and 1C, it will be recognized that the first photodiode 18 structurally differs from the second photodiode 20 in an important respect that causes the first photodiode 18 to be relatively efficient and the second photodiode to be relatively fast, comparing one photodiode to the other. Fast photodiode 20 includes a P-well 40 that is absent from efficient photodiode 18. In photodiode 18, the P-type region 56 effectively defines the anode region of the diode. In photodiode 20, the P-well 40 effectively defines the anode region of the diode. In the photodiode 20, the relatively shallow P-type region 58 is included for process simplification, but is functionally insignificant. In photodiode 18 of FIG. 1B, the functionally significant portion of the PN junction of the diode is defined between P-type anode region 56 and the underlying portion of the N-type epitaxial layer 34. The annular P+ contact region 67 provides good ohmic contact to the silicide contact 74, but does not play a significant role in the photoelectric function of the photodiode 18. In the photodiode 20 of FIG. 1C, the PN junction of the diode is defined between P-type anode region 40 and the underlying portion of N-type epitaxial layer 34.

In the process described above, it is preferred that the N-type epitaxial layer be grown to a thickness of 2.4 microns. As previously noted, during thermal processing the phosphorus used to make the N+ buried layers 24 and 26 diffuses up into the epitaxial layer 34 as it grows. The extent of this upward diffusion is about 0.7 micron. Above this lower 0.7 micron portion, the N-type dopant concentration of the epitaxial layer is very light and essentially constant up to the silicon surface. This dopant concentration is a function of the specified resistivity, which is preferably in the range of from 1 to 5 ohm-cm. If the device 10 includes bipolar transistors, the preferred resistivity of the N-type epitaxial layer 34 is at the lower end of the preferred range, or about 1 ohm-cm. If the device 10 has only MOS transistors and no bipolar transistors, the preferred resistivity of the N-type epitaxial layer 34 is at the upper end of the preferred range, or about 5 ohm-cm.

As will be appreciated by those skilled in the art, the boundary between the N+ buried layer 24 (or 26) and the very lightly-doped N-type epitaxial material thereabove is difficult to precisely locate. Therefore, by definition herein, the boundary between the N+ buried layer 24 (or 26) and the very lightly-doped N-type epitaxial layer 34 occurs where the N-type dopant concentration moving upward in the buried layer drops to 1.2 times the constant N-type dopant concentration of the epitaxial layer 34 thereabove. This factor is chosen because it is difficult to measure differences in dopant concentrations of less than 20 percent.

Preferably, the depth of P-type anode region 56 in the photodiode 18 of FIG. 1B is about 0.2 micron below the silicon surface. In other words, the depth of the PN junction between the P-type anode region 56 and the N-type epitaxial layer 34 is about 0.2 micron below the silicon surface. Thus, the vertical height or thickness of the portion of the N-type epitaxial layer 34 extending up from the boundary with the N+ buried layer 24 to the PN junction formed with the anode region 56 is about 1.5 microns. This 1.5 micron thick portion of the N-type epitaxial layer 34 will be referred to herein as the efficient drift region. If the process and application permits, it would be desirable to make the efficient drift region even much thicker.

Preferably, the depth of the P-type anode region 40 in the photodiode 20 of FIG. 1C is about 1.0 micron below the silicon surface. In other words, the depth of the PN junction between the P-type anode region 40 and the N-type epitaxial layer 34 is about 1.0 micron below the silicon surface. Thus, the vertical height or thickness of the portion of the N-type epitaxial layer 34 extending up from the boundary with the N+ buried layer 24 to the PN junction formed with the anode region 40 is about 0.7 micron. This 0.7 micron thick portion of the N-type epitaxial layer 34 will be referred to herein as the fast drift region.

A design consideration in the structures of the photodiodes 18 and 20 is to employ the same process technology and the same sequence of steps for making the PMOS transistor 14, the NMOS transistor 16 and similar elements in the course of manufacturing other types of MOS integrated circuit devices that have no photodiodes. It will be appreciated that all that is necessary to make the device 10 with two different types of photodiodes (the efficient type shown in FIG. 1B and the fast type shown in FIG. 1C) is to provide photomasks (or "reticles") that are designed to incorporate the photodiodes 18 and 20, since these photodiodes are built up using structural elements that are also used to make the PMOS and NMOS transistors on the device 10. Most importantly, it should be noted that the P-type anode region 56 of the efficient photodiode 18 corresponds to the PLDD regions 52 of the PMOS transistor 14, and that the P-type anode region 40 of the fast photodiode 20 corresponds to the P-well 38 of the NMOS transistor 16.

The difference in depth of the two different anode regions 56 and 40 permits the respective portions of the N-type epitaxial layer 34 that define the efficient drift region (in photodiode 18) and the fast drift region (in photodiode 20) to be dimensionally differentiated to a significant degree. By way of definition herein, a fast drift region will have a thickness that is less than one micron and an efficient drift region will have a thickness that is substantially greater than one micron. It will be noted that, in accordance with the preferred embodiment, the efficient drift region of photodiode 18 is made more than twice as thick (1.5 microns) as the thickness of the fast drift region (0.7 micron).

As those skilled in the art will appreciate, the efficient photodiode 18 with its relatively thick drift region (1.5 microns) can generate significantly more hole-electron pairs under the same incident light beam as the fast photodiode 20 with its relatively thin drift region (0.7 micron). On the other hand the transit times for carriers through the drift regions are also significantly different for the two different photodiodes. The transit time for the fast photodiode 20 is much less than for the efficient photodiode 18 based on the relative thicknesses of the drift regions in the two different photodiodes. Thus, the response time of photodiode 20 is much faster than for photodiode 18.

The present invention recognizes the advantage to system designers of having the capability of including both relatively fast and relatively efficient photodiodes on the same integrated circuit device. Yet this advantage can be achieved using existing process technology and process flows to fabricate the device 10 described herein and similar such devices by merely creating a new photomask set.

Those skilled in the art will appreciate that the structure of a silicon resistor, over which a silicide-blocking mask is retained as described above, will appear in cross section very similar to either of the photodiodes 18 or 20. For example, the photodiode 18 of FIG. 1B has a lightly-doped P-type region 56 covered by dielectric film 76, and heavily-doped contact regions 67 at opposite ends of the lightly-doped region 56 with silicide contacts 74 formed above and contacting the heavily-doped regions 67. A similar structure can be connected in the circuit as a silicon resistor by using the silicide contacts 74 as terminals for the resistor to which separate metal connections are made. The dielectric film 76 of FIG. 1B would then serve as the silicide-blocking mask for the resistor. Of course, it would not be necessary to place a window over the resistor as is necessary for the photodiode 18. In other words, viewed in cross section, P-type region 56 laid out in a strip with separate contact regions 67 and terminal contacts 74 can serve as a resistor in the device. By contrast, the photodiode 18 uses an annular contact region 67 and similarly-shaped anode contact 74, and includes an annular contact region 66 and similarly-shaped cathode contact 72 that are not needed to construct the above-mentioned resistor.

Although a preferred embodiment of the invention has been described in detail, it is to be understood that various changes, substitutions and alterations can be made therein without departing from the spirit and scope of the invention as set forth in the appended claims.

What is claimed is:

1. A method for making an integrated circuit device on a single semiconductor chip including a photodiode thereon, comprising:

providing a substrate;

growing a lightly doped N-type epitaxial layer on the substrate, the epitaxial layer defining an upper silicon surface;

forming regions of different conductivity type and dopant concentration in the epitaxial layer to define transistors and a photodiode therein, the transistors including P-type and N-type regions in the epitaxial layer extending from the upper silicon surface to depths therebelow, the photodiode including a P-type anode region in the epitaxial layer extending from the upper silicon surface to a depth therebelow, an N+ buried layer beneath the anode region, and a drift region consisting of a portion of the lightly doped N-type epitaxial layer separating the anode region from the buried layer;

depositing a dielectric film on the integrated circuit device including over the upper silicon surface of the anode region, the dielectric film being transparent to radiation at a wavelength to which the photodiode is responsive;

selectively removing portions of the dielectric film to expose silicon surfaces where silicide contact layers are to be formed including over the P-type and N-type regions of the transistors, and retaining the dielectric film over silicon surfaces where silicidation is to be prevented; and forming suicide contact layers on the exposed silicon surfaces;

wherein the dielectric film serves as a suicide-blocking mask for the silicon surfaces where silicidation is to be prevented and an antireflective film for the photodiode.

2. The method of claim 1 wherein the silicon surfaces where silicidation occurs includes contact regions for anode and cathode contacts to the photodiode.

3. The method of claim 1 wherein the dielectric film comprises two layers formed by depositing a silicon oxide layer to a thickness of about 30 nanometers directly on the upper silicon surface of the anode region, and then depositing a silicon nitride layer to a thickness of about 50 nanometers directly on the silicon oxide layer, whereby the wavelength of radiation to which the photodiode is responsive is in the red visible spectrum.

4. The method of claim 3 wherein, following formation of the dielectric film, at least one additional dielectric layer is deposited on the integrated circuit device including over the silicon nitride layer, and then a window is opened over the photodiode by selective etching of the at least one additional dielectric layer over the photodiode down to the silicon nitride layer.

5. The method of claim 2 further comprising forming an N+ sinker extending from the cathode contact region at the silicon surface to the N+ buried layer therebelow.

* * * * *